US008836389B2

(12) United States Patent
Vandepas

(10) Patent No.: US 8,836,389 B2
(45) Date of Patent: Sep. 16, 2014

(54) APPARATUS, SYSTEM, AND METHOD FOR CONTROLLING TEMPERATURE AND POWER SUPPLY VOLTAGE DRIFT IN A DIGITAL PHASE LOCKED LOOP

(75) Inventor: Martin Vandepas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/991,614

(22) PCT Filed: Sep. 28, 2011

(86) PCT No.: PCT/US2011/053702
§ 371 (c)(1),
(2), (4) Date: Jun. 4, 2013

(87) PCT Pub. No.: WO2013/048390
PCT Pub. Date: Apr. 4, 2013

(65) Prior Publication Data
US 2013/0249611 A1 Sep. 26, 2013

(51) Int. Cl.
H03L 7/06 (2006.01)
H03L 7/099 (2006.01)
H03L 1/02 (2006.01)

(52) U.S. Cl.
CPC ............ H03L 7/0993 (2013.01); H03L 2207/50 (2013.01); H03L 1/02 (2013.01)
USPC .......................................... 327/156; 327/147

(58) Field of Classification Search
None
See application file for complete search history.

(56) References Cited

U.S. PATENT DOCUMENTS

| 7,728,686 | B2 | 6/2010 | Zhan et al. | |
|---|---|---|---|---|
| 7,750,701 | B2 | 7/2010 | Ainspan et al. | |
| 7,940,097 | B2 | 5/2011 | Chen | |
| 8,331,520 | B2* | 12/2012 | Ueda et al. | 375/376 |
| 8,618,854 | B2* | 12/2013 | Narathong et al. | 327/159 |
| 2010/0148881 | A1* | 6/2010 | Moussavi | 331/36 C |
| 2010/0277244 | A1* | 11/2010 | Chang et al. | 331/16 |
| 2011/0069792 | A1 | 3/2011 | Chen | |
| 2012/0074993 | A1* | 3/2012 | Chen et al. | 327/147 |
| 2012/0081159 | A1* | 4/2012 | Wu | 327/156 |
| 2012/0161834 | A1* | 6/2012 | Lee et al. | 327/156 |

OTHER PUBLICATIONS

International Search Report and Written Opinion mailed Apr. 27, 2012 for International Patent Application No. PCT/US2011/053702.

* cited by examiner

Primary Examiner — Cassandra Cox
(74) Attorney, Agent, or Firm — Blakely, Sokoloff, Taylor & Zafman LLP

(57) ABSTRACT

Described herein are apparatus, system, and method for controlling temperature drift and/or voltage supply drift in a digital phase locked loop (DPLL). The apparatus comprises a DPLL including a digital filter to generate a fine code for controlling a frequency of an output signal of a digital controlled oscillator (DCO) of the DPLL; a logic unit to monitor the fine code and to generate a compensation signal based on the fine code; and a voltage adjustment unit to update a power supply level to the DCO based on the compensation signal, wherein the updated power supply level to cause the digital filter to generate the fine code near the middle of an entire range of the fine code across various temperatures, and wherein the digital filter to generate the fine code near the middle of the entire range across power supply drift.

28 Claims, 8 Drawing Sheets

US 8,836,389 B2

APPARATUS, SYSTEM, AND METHOD FOR CONTROLLING TEMPERATURE AND POWER SUPPLY VOLTAGE DRIFT IN A DIGITAL PHASE LOCKED LOOP

CLAIM OF PRIORITY

This application claims the benefit of priority of International Patent Application No. PCT/US2011/053702 filed Sep. 28, 2011, titled "APPARATUS, SYSTEM, AND METHOD FOR CONTROLLING TEMPERATURE AND POWER SUPPLY VOLTAGE DRIFT IN A DIGITAL PHASE LOCKED LOOP," which is incorporated by reference in its entirety.

FIELD OF THE INVENTION

Embodiments of the invention relate generally to the field of digital phase locked loops (DPLLs). More particularly, embodiments of the invention relate to apparatus, system, and method for controlling temperature drift and power supply voltage drift in a DPLL.

BACKGROUND

A typical digital phase locked loop (DPLL) consists of a phase detector to detect a phase of a reference signal and a feedback signal, a digitally controlled oscillator (DCO) to generate an output clock signal, a digital loop filter to generate fine and/or coarse control code to control the frequency of the output clock signal from DCO, and a divider to divide the output clock signal from the DCO to generate the feedback signal. During normal operation of the DPLL, the digital filter generates a coarse control code for the DCO and freezes that coarse control code. The digital filter then adjusts the fine control code to gradually change the frequency of the DCO till a phase lock is achieved by the DPLL. The term "changing the frequency of the output signal from the DCO" and "changing the frequency of the DCO" are interchangeably used.

As temperature of a processor comprising the DPLL changes, a fine control code to control the frequency of the output signal from DCO of the DPLL also changes. This change in the fine control code due to temperature change/drift may require that the DPLL be designed with a wider range of fine control code to compensate for temperature changes, power supply drifting, aging of devices of the DPLL, and other forms of process variations. Without a wider range of fine control code, the fine control code may run out of range while trying to lock the DPLL and trying to compensate for the above mentioned changes. An unlocked DPLL means that the processor may not have phase locked clock signals and so the processor may not operate properly.

However, designing a DCO to operate for a wider range of fine control code, to compensate for the changes mentioned above, results in a larger sized DCO which results in higher power consumption, larger silicon area, and higher quantization noise of the DCO. Furthermore, the logic unit for generating a wider range of fine code settings requires more logic to generate more bits for the fine control code.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

SUMMARY

Figure 1:
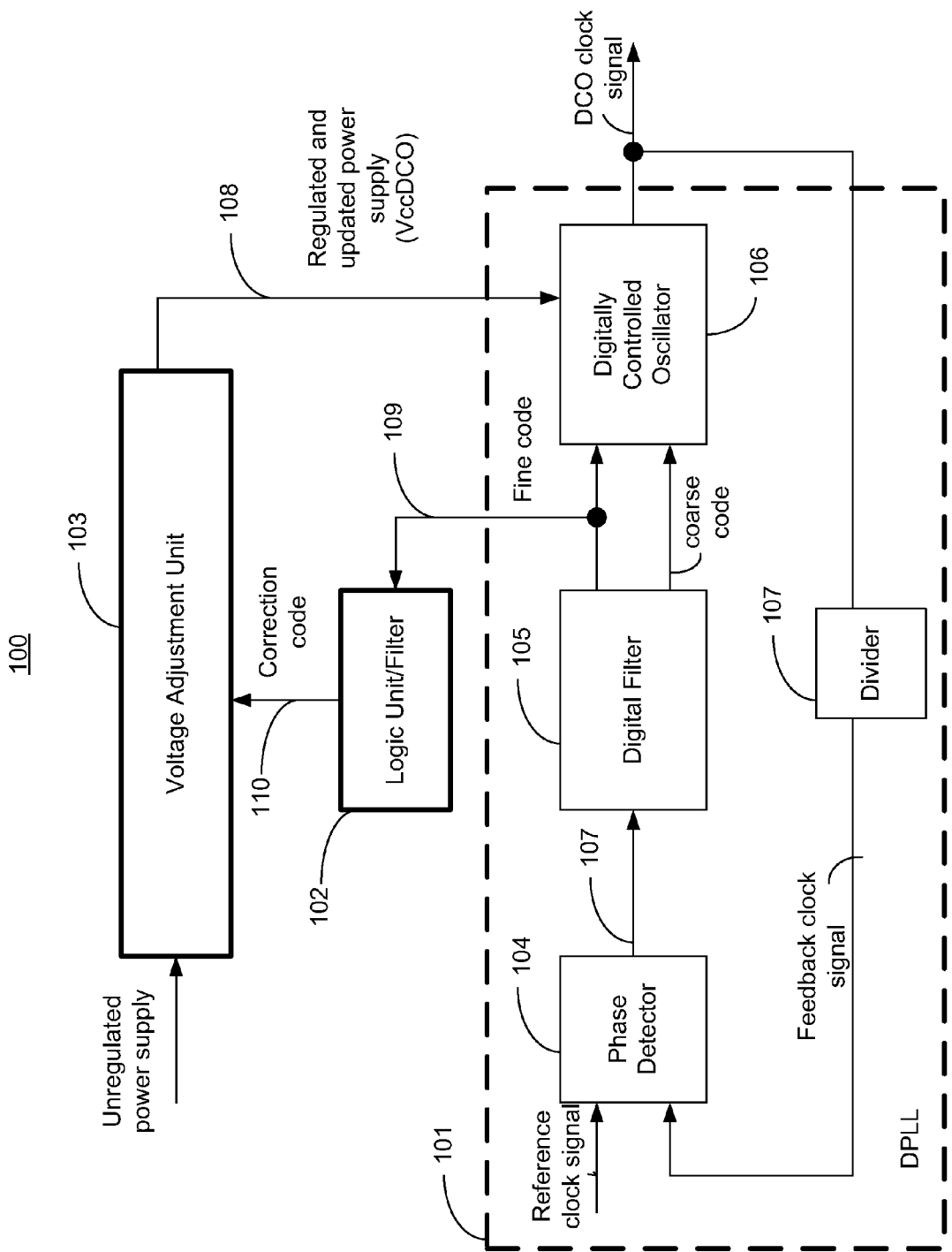
FIG. 1 is digital phase locked loop (DPLL) which is operable to have a fine control code near the middle of the range of the fine control code, according to one embodiment of the invention.

Embodiments of the invention relate an apparatus, system, and method for controlling temperature drift and power supply voltage drift in a digital phase locked loop (DPLL).

In one embodiment, the apparatus comprises DPLL including a digital filter to generate a fine code for controlling a frequency of an output signal of a digital controlled oscillator (DCO) of the DPLL, the DCO being supplied a power supply level; a logic unit to monitor the fine code and to generate a compensation signal based on the fine code; and a voltage adjustment unit to update the power supply level based on the compensation signal.

In one embodiment, the system comprises a display; and a processor coupled to the display, the processor comprising: a DPLL including a digital filter to generate a fine code for controlling a frequency of an output signal of a DCO of the DPLL, the DCO being supplied a power supply level; a logic unit to monitor the fine code and to generate a compensation signal based on the fine code; and a voltage adjustment unit to update the power supply level based on the compensation signal.

In one embodiment, the method comprises generating a fine code for controlling a frequency of an output signal of a DCO of a DPLL, the DCO being supplied a power supply level; monitoring the fine code; generating a compensation signal based on the monitored fine code; and updating the power supply level based on the compensation signal.

DETAILED DESCRIPTION

Embodiments of the invention relate an apparatus, system, and method for controlling temperature drift and power supply voltage drift in a digital phase locked loop (DPLL). In one embodiment, as temperature of the processor comprising the DPLL drifts, the regulated supply to the digitally controlled oscillator (DCO) is adjusted while ensuring that the target frequency of the DCO is generated by keeping the fine control code near the middle of the fine control code range. In one embodiment, only the regulated supply to the DCO is adjusted while the other components of the DPLL operate on another regulated supply different from the adjusted regulated supply to the DCO.

The term "near" or "substantially near" herein refers to being within 10-20% from the middle of the fine control code range or 0-2 bit codes away from the middle of the fine control code range.

The technical effect of correcting the temperature drift and power supply voltage drift allows for a digital filter and the DCO to have simpler design because the fine control code range is reduced by keeping the fine control code setting near the middle of the range of the fine control code. By reducing the fine control code range, the DCO has fewer load capacitors, i.e. less switching capacitance that translates to lower power consumption and silicon area. Additionally, by reducing the fine control code range the digital filter has fewer number of logic units (including adders) to generate a fine control code for the DCO, i.e. lower power consumption and silicon area.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1 is high level block diagram 100 comprising a DPLL 101 which is operable to have a fine control code setting near the middle of the range of the fine control code, according to one embodiment of the invention. In one embodiment, the DPLL 101 comprises a phase detector 104 which is operable to compare the phases of the reference clock (clk) signal and a feedback clock signal and to generate an output 107 indicating a phase difference between the reference clock signal and the feedback clock signal. In one embodiment, the phase detector 104 is a bang-bang phase detector with a single bit output 107 that indicates whether the phase of the feedback clock signal is ahead or behind the phase of the reference clock signal. In one embodiment, the phase detector 104 outputs a bus 107 with bits that indicates how much the phase of the feedback clock signal is ahead or behind the phase of the reference clock signal.

In one embodiment, the output 107 of the phase detector 104 is input to a digital filter 105 which is operable to generate a fine control code 109 and a coarse control code, where the fine control code 109 and the coarse control code adjust the frequency of a DCO 106 coupled to the digital filter 105. In one embodiment, the digital filter 105 is generated by a synthesis tool that synthesizes a Register Transfer Language (RTL) description of the digital filter into hardware.

In one embodiment, the fine control code 109 is a 10 bit code. In one embodiment, the coarse control code is a 7 bit code. In other embodiments, other sizes for the fine and coarse control codes may be used that have enough range to lock the DPLL for various frequency ranges and across process voltage and temperature (PVT) corners. In one embodiment, the digital filter 105 generates a coarse control code that corresponds to the target frequency as close as possible. The digital filter 105 then freezes the coarse control code and begins to adjust the fine control code 109 to achieve a phase lock.

In one embodiment, the coarse control code selects a chain of inverters, i.e. delay elements, in the DCO 106 to be added in parallel to an existing ring oscillator (comprising delay elements) of the DCO 106 to cause the existing ring oscillator to slow down, i.e. slow the frequency of the output DCO clock signal (DCO Clk). In one embodiment, each least significant bit (LSB) of the coarse control code causes a frequency step size change to the DCO clock signal by 20 MHz. In one embodiment, the fine control code 109 selects one or more capacitive loads on the delay elements of the DCO 106, where the one or more capacitive loads change the output frequency of operation of the ring oscillator of the DCO 106 by a small amount e.g., 1 MHz per LSB of the fine control code 109.

In one embodiment, the DCO 106 operates on a dedicated regulated power supply 108 (VccDCO). In one embodiment, as the level of the power supply 108 reduces from its nominal level (e.g., 1.2 V), the operational frequency of ring oscillator of the DCO 106 reduces thus slowing the frequency of the DCO clock signal. The output frequency of DCO clock signal for a given fine/coarse control code depends on the voltage level of the regulated power supply 108.

The embodiments of the invention discussed herein also operate for process technologies exhibiting reverse temperature coefficient (RTC) that causes the transistors to speed up as they are heated (rather than traditionally slowing down). As mentioned in the background section, as temperature of the processor comprising the DPLL changes, the digital filter 105 changes the fine control code 109 so as to keep the DPLL locked. In cases when the temperature continues to change (e.g., temperature rises from 80 degree Celsius to 100 degree Celsius), the fine control code 109 may run out of range causing the DPLL to lose lock.

In one embodiment, a logic unit 102 is added to the DPLL 101 that monitors the average value of the fine control code 109 and generates a correction code 110 representing how far the fine control code 109 is away from the middle of the average fine control code range. In one embodiment, the logic unit 102 is a digital filter that can be incorporated within the digital filter 105.

In one embodiment, the correction code 110 is generated by the following pseudo-code. In one embodiment the logic unit 102 is generated by synthesizing an RTL corresponding to:

For every Reference Clock assertion, accumfnerr+
       =fncode−fixedValue

If (|accumfnerr|>threshold) then {correctionWord+
      =sign(accumfnerr); accumfnnerr=0;} where the "fixedValue" is a bit value which is the middle of the fine control code range (e.g., 10'b0111111111 for a 10 bit fine code), the "fncode" is the current fine control code 109, threshold is a value/offset representing how far the fine control code 109 is allowed to move from the middle (fixedValue) of the fine control code range, sign(accumfnerr) is a function that outputs a plus or minus sign of the variable accumfnerr, accumfnerr is the average/accumulative fine control code error, correctionWord is the output correction code 110 from the logic unit 102 that is input to the voltage adjustment unit 103. The above pseudo-code is discussed in more detail with reference to FIG. 6A.

In one embodiment, the logic unit 102 comprises: logic for determining a difference between an average fine code setting and a middle of a range of the fine code setting; logic for comparing the difference with a predetermined threshold; and logic for incrementing or decrementing bits of the temperature compensation signal (or simply compensation signal) in response to the comparing.

Referring back to FIG. 1, in one embodiment the correction code 110 is input to a voltage adjustment unit 103, where the correction code 110 adjusts the power supply level 108 to cause the fine control code 109 to remain near the middle of the fine control code range. Since the DCO 106 is part of the loop of the DPLL 101, the digital filter 105 generates a fine control code 109 to ensure that the output frequency of the DCO 106 remains constant. In one embodiment, the voltage adjustment unit 103 scales the reference voltage 108 linearly with the value of the correction code 110. In one embodiment, the voltage adjustment unit 103 comprises a voltage regulator that tracks to the regulated supply and changes the frequency of the DCO clock signal. In one embodiment, the DPLL 101 maintains the target frequency of DCO clock signal and phase lock by adjusting the fine control code 109 back near the middle of the fine control code range.

In one embodiment, the DCO 106 has a high VccDCO gain ($K_{VCC}$) and so a small change to the regulated supply can correct for temperature drift. In such an embodiment, the voltage control unit 103 generates a nearly flat sloped adjusted power supply level 108 to cause slow change to the frequency of the DCO clock signal. In one embodiment, the logic unit/filter 102 has a very low bandwidth compared to the bandwidth of the DPLL 101 because the temperature drift generally occurs on a very long time scale (e.g., several seconds or minutes). Such bandwidth separation between the bandwidth of the logic unit/filter 102 and the bandwidth of the DPLL 101 prevents any adverse interaction (e.g., loop instability) with the DPLL loop. In one embodiment, the voltage adjustment unit 103 has the means for generating high resolution voltage reference trimming (e.g., 50 mV/150 μs).

While the embodiments herein refer to the DPLL 100 as being used in microprocessors, it is understood that the DPLL 100 can be used in systems other than microprocessors, for example, Radio Frequency (RF) circuits for cell phone radios or as a standalone clock generator chip, etc.

Figure 2A:
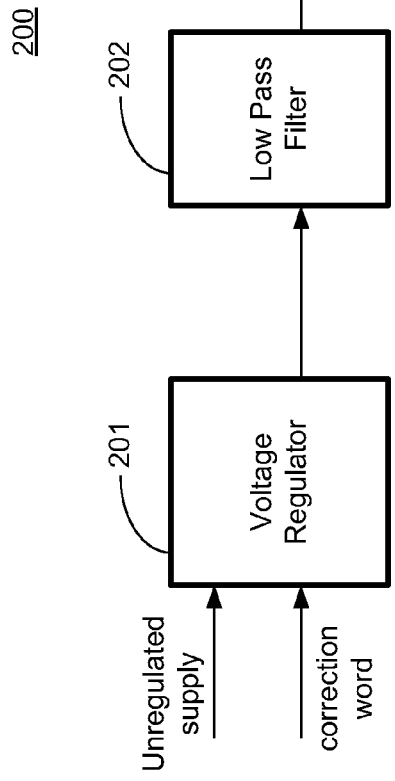
FIG. 2A-C are various embodiments of the voltage adjustment unit coupled to the DPLL which adjusts the regulated supply to the digitally controlled oscillator (DCO) to cause the fine control code to be near the middle of the range of the fine control code.
Figure 2B:
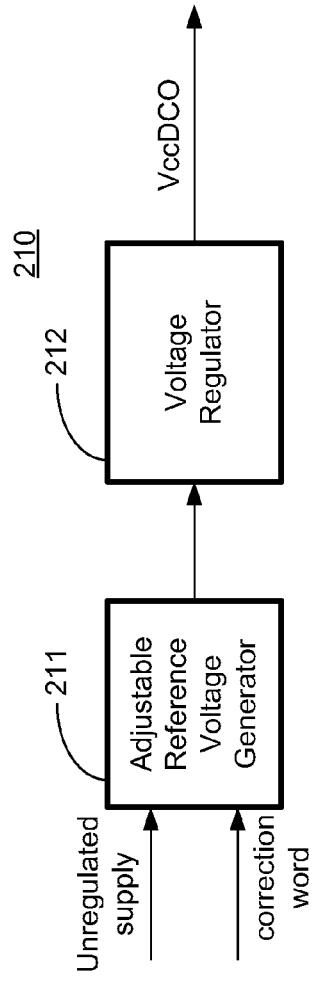
Figure 2C:
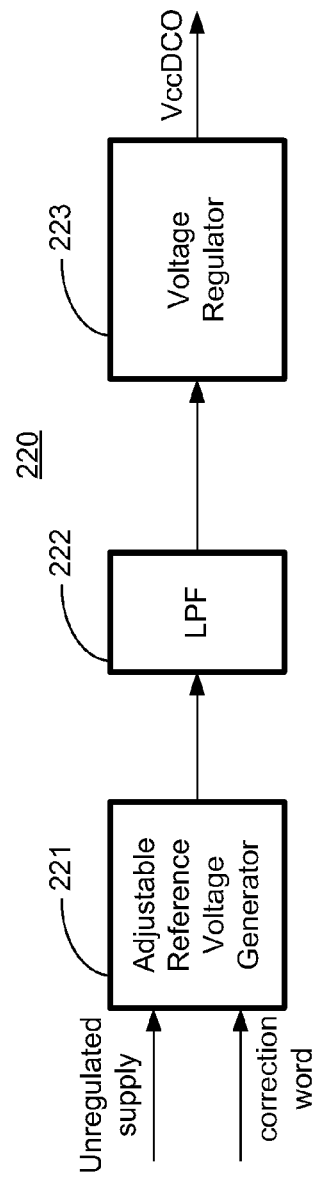

FIG. 2A-C are various embodiments 200, 210, and 220 of the voltage adjustment unit 103, coupled to the DPLL 101, which cause the fine control code setting to be near the middle of the range of the fine control code.

The embodiment 200 of FIG. 2A is a voltage control unit 103 that comprises a voltage regulator 201 to regulate the unregulated supply according to the correction code 110. In one embodiment, the voltage control unit 103 also comprises a low pass filter 202 to filter any sharp change in the regulated supply level so that the output VccDCO introduces a slight change to the VccDCO level for the DCO 106.

The embodiment 210 of FIG. 2B is a voltage control unit 103 that comprises an adjustable reference voltage generator 211 that generates reference voltage from an unregulated supply. In one embodiment, the reference voltage generator 211 comprises a bandgap voltage generator. So as not to obscure the embodiments of the invention details of the bandgap voltage generator and methods to trim/adjust output of the bandgap voltage generator are not described in detail because they are well known. In one embodiment, the correction code 110 adjusts the voltage and/or current level of the bandgap generator to cause a change in the reference voltage level output from the adjustable reference voltage generator 211.

In one embodiment, the reference voltage generator 211 comprises resistor divider network. So as not to obscure the embodiments of the invention details of a resistor divider network is not shown because they are well known. In one embodiment, the correction code 110 forms a multiplexer select signal to select from any one of the resistor divider taps, where each tap represents a different voltage level obtained from the resistor divider. In other embodiments, other forms of reference generators may be used that have the ability to change the reference level according to the correction code 110.

In one embodiment, the voltage control unit 103 further comprises a voltage regulator 212 to regulate the reference voltage generated by the adjustable reference voltage generator 211 to generate VccDCO power supply.

FIG. 2C is another embodiment 220 of the voltage control unit 103, the voltage control unit 103 is similar to the embodiment of FIG. 2B except that a low pass filter 222 is placed between a reference voltage generator 221 and a voltage regulator 223. In one embodiment, low pass filter 222 filters any sharp change in the reference voltage from the reference voltage generator 221 so that the voltage regulator 221 has a stable supply to regulate to generate the output VccDCO power supply. In one embodiment, the output from the voltage regulator changes by 50 mV/150 μs.

Figure 3:
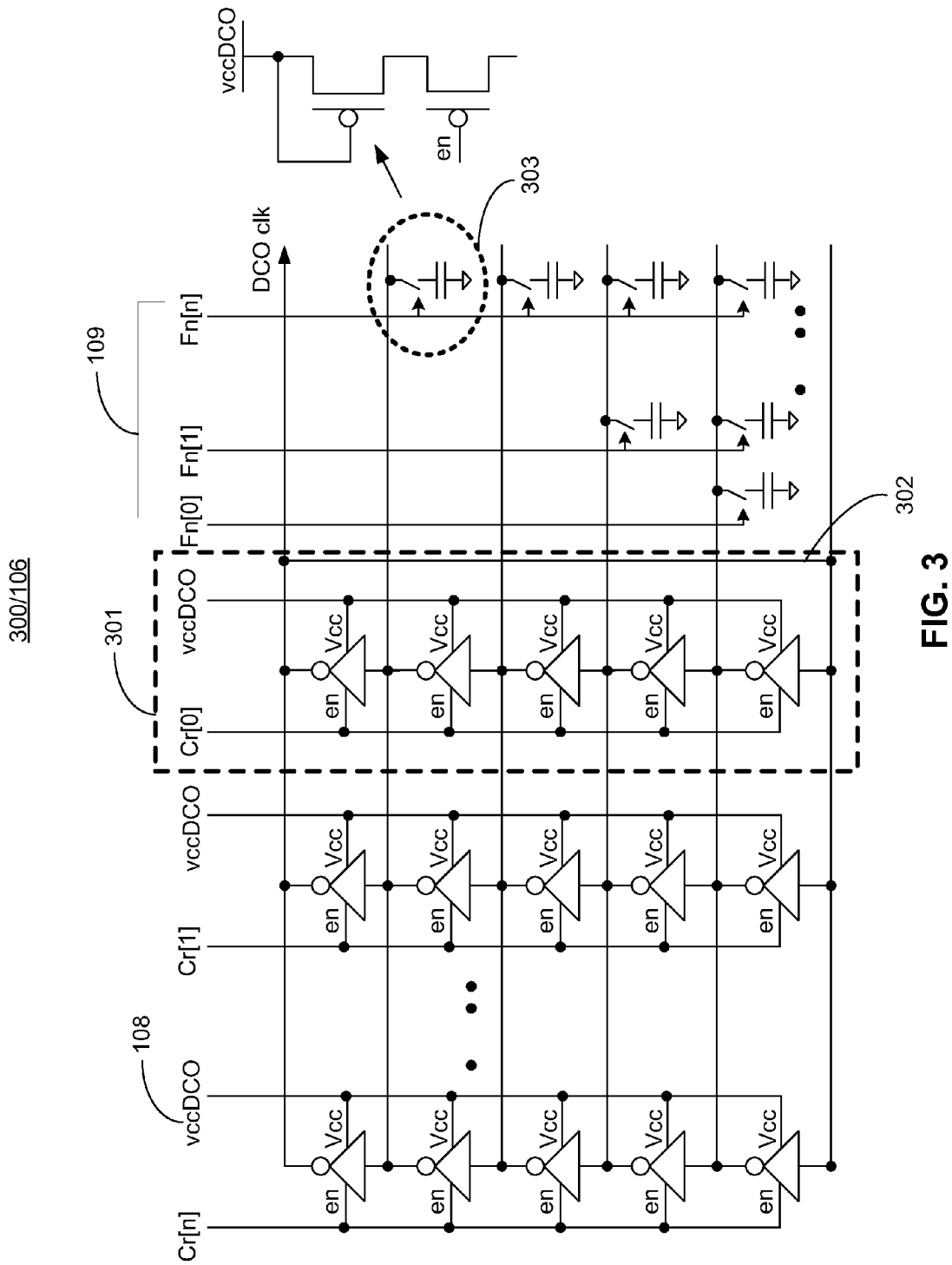
FIG. 3 is a DCO of the DPLL which is operable to generate an output frequency with adjusted power supply level, according to one embodiment of the invention.

FIG. 3 is circuit level diagram of the DCO 300/106 of the DPLL 101 which is operable to generate an output frequency with adjusted power supply level, according to one embodiment of the invention. In one embodiment, the ring oscillator 301 comprises odd or even number of delay elements (shown as inverters) configured in a feedback loop 302. In one embodiment, the ring oscillator 301 operates on a VccDCO power supply provided by the voltage adjustment unit 103. The additional chain of inverters (delay elements) are enabled or disabled by coarse control code bits Cr[1] through Cr[n], where 'n' is an integer greater than 1. In the embodiment of FIG. 3, Cr[0] always keeps the ring oscillator 301 enabled unless the DPLL is being shut down. In one embodiment, the additional chain of inverters (delay elements) when enabled, add extra drive strength to the delay elements of the ring oscillator 301 causing the ring oscillator 301 to speed up thus generating a higher frequency DCO clock signal.

In one embodiment, the fine control code 109 (Fr[0]-Fr[n] (where 'n' is an integer greater than 1) adds extra capacitance (e.g., 303) to the output of the delay elements of the ring oscillator 301. In one embodiment, the capacitor 303 comprises a diode connected transistor coupled with another transistor which is enabled or disabled by the fine control code bits. The embodiments herein result in fewer capacitors 303 because the fine control code range is reduced by keeping the fine control code near the middle of the range as the level of VccDCO is adjusted by the voltage control unit 103. The technical effect of reduced number of capacitors 303 is reduced power consumption and silicon area of the DCO 106.

Figure 4:
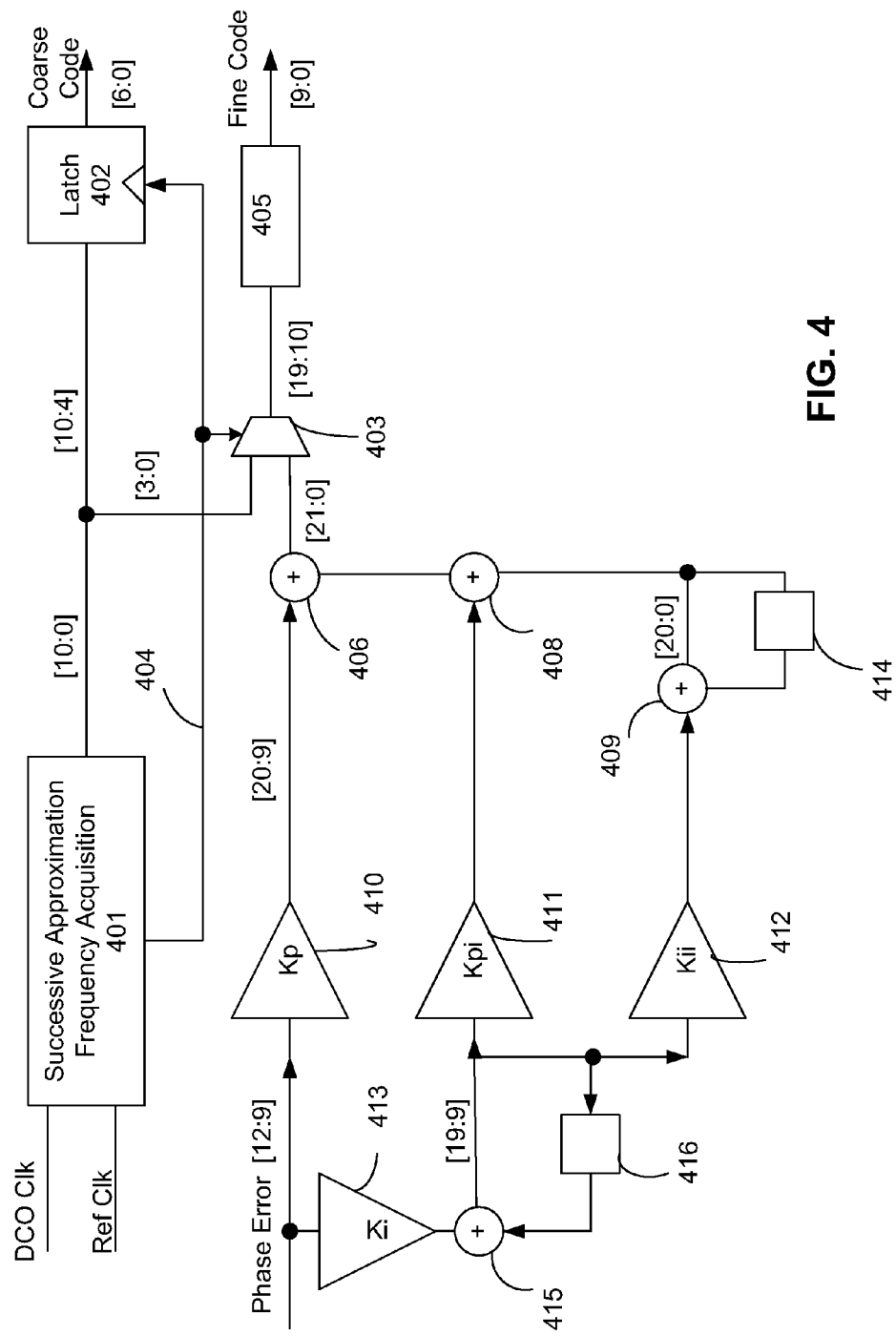
FIG. 4 is a digital filter of the DPLL which is operable to generate a fine control code near the middle of the range of the fine control code, according to one embodiment of the invention.

FIG. 4 is the digital filter 105 of the DPLL 101 which is operable to generate a fine control code setting near the middle of the range of the fine control code, according to one embodiment of the invention. In one embodiment, at initial startup of the DPLL 101, the Successive Approximation Frequency Acquisition machine 401 adjusts the Coarse Code until the DCO 106 reaches the desired frequency. In such an embodiment, the machine 401 then generates a signal 404 to freeze the output of the Coarse Code by means of a latch 402. The Course Code in FIG. 4 is shown as a 7 bit code. In other embodiments, fewer or more bits of code can be used for the Course Code.

In one embodiment, in response to freezing the Coarse Code, phase acquisition of the DPLL 101 starts and the signal 404 causes a multiplexer 403 to switch and to allow control of the Fine Code. The Fine Code in FIG. 4 is shown as a 10 bit code. In other embodiments, fewer or more bits of code can be used for the Fine Code. The embodiments of the invention cause the Fine Code to remain near the center of its range and so the number of bits for the Fine Code can be reduced, thus reducing the logic size of the digital filter 400/105 and its corresponding power consumption.

In one embodiment, the digital filter 400/105 applies scalars Kp 410, Ki 413, Kpi 411, and Kii 412, and adders 406, 408, 409, 415, and accumulators 414 and 416 to process the Phase Error signal from the PD 104. The processed signal is then input to the multiplexer 403 and then output to the DCO 106 as Fine Code when the signal 404 causes the multiplexer 403 to switch. In one embodiment, the coefficients of the scalars Kp 410, Ki 413, Kpi 411, and Kii 412 control different tradeoffs between stability, bandwidth, and jitter. In one embodiment, the output of the adder 415 is an internal representation of the average fine code and is used by the logic 102 to generate the correction code 110. In one embodiment, a limiter 405 is introduced to prevent the Fine Code from overflowing. In one embodiment, logic blocks 405, 411, 412, 409, and 414 can be removed to reduce power consumption.

Figure 5:
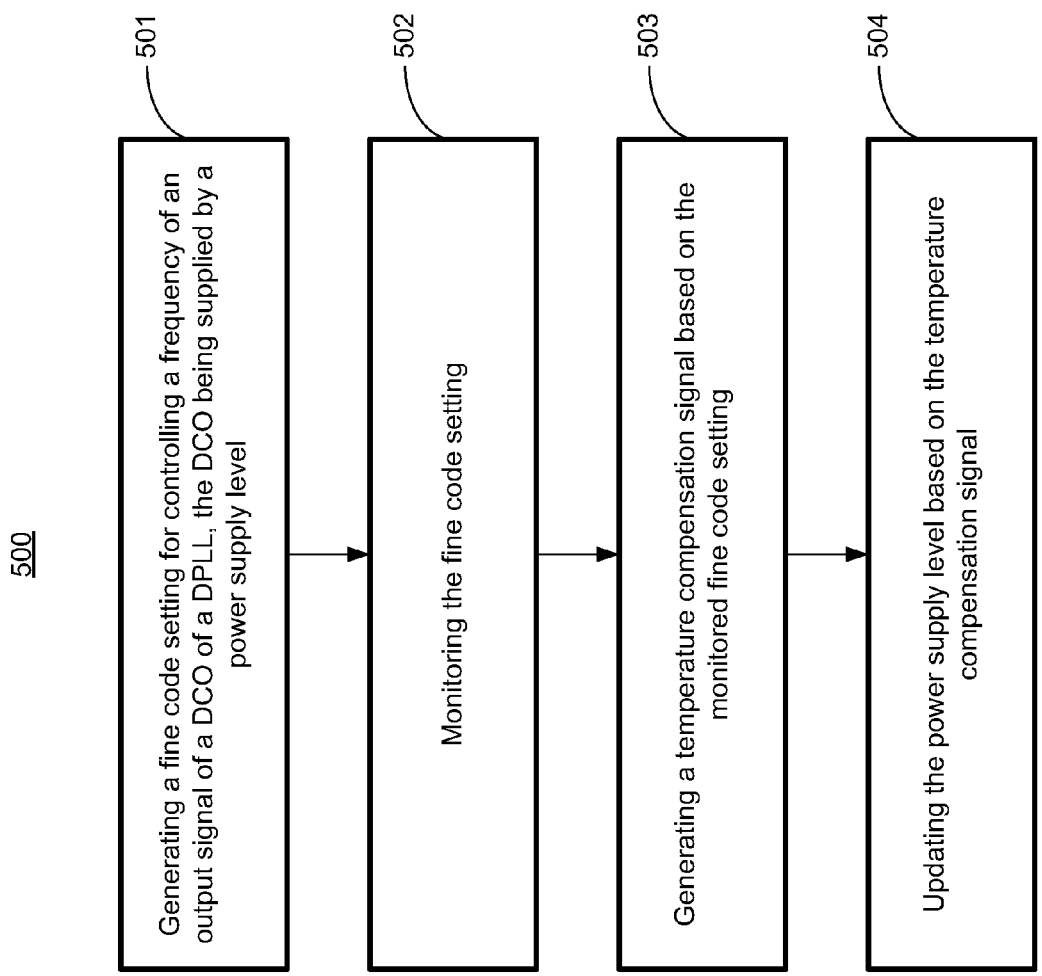
FIG. 5 is a method flowchart for updating a power supply level of the DCO with temperature drift, according to one embodiment of the invention.

FIGS. 5-6 are method flowcharts that cause the fine control code to remain near the middle during temperature drift by adjusting the power supply level to the DCO, according to various embodiments. Although the blocks in the flowcharts are shown in a particular order, the order of the actions can be modified. Thus, the illustrated embodiments can be performed in a different order, and some actions/blocks may be performed in parallel. Additionally, one or more actions/blocks can be omitted in various embodiments for controlling temperature drift and power supply voltage drift in the DPLL 101.

FIG. 5 is a method flowchart 500 for updating a power supply level of the DCO 106 with temperature drift, according to one embodiment of the invention. The method flowchart is described with reference to the embodiments of FIGS. 1-4.

At block 501 the digital filter 105 generates a fine control code 109 for controlling a frequency of the output of the DCO 106. At block 502, the logic unit 102 monitors the fine control code 109 to determine how far the average fine control code is from the middle of the range of the fine control code. At block 503, the logic unit 102 generates a correction code 110 (also called the temperature compensation signal or compensation signal) based on the monitored fine control code 109. At block 504, the voltage adjustment unit 103 updates/adjusts the power supply level (VccDCO) to the DCO 106 based on the correction code 110. The loop of the DPLL 101 ensures that, as the VccDCO level adjusts, the target frequency of the DCO 106 is generated by keeping the fine control code 109 near the middle of the fine control code range.

Figure 6A:
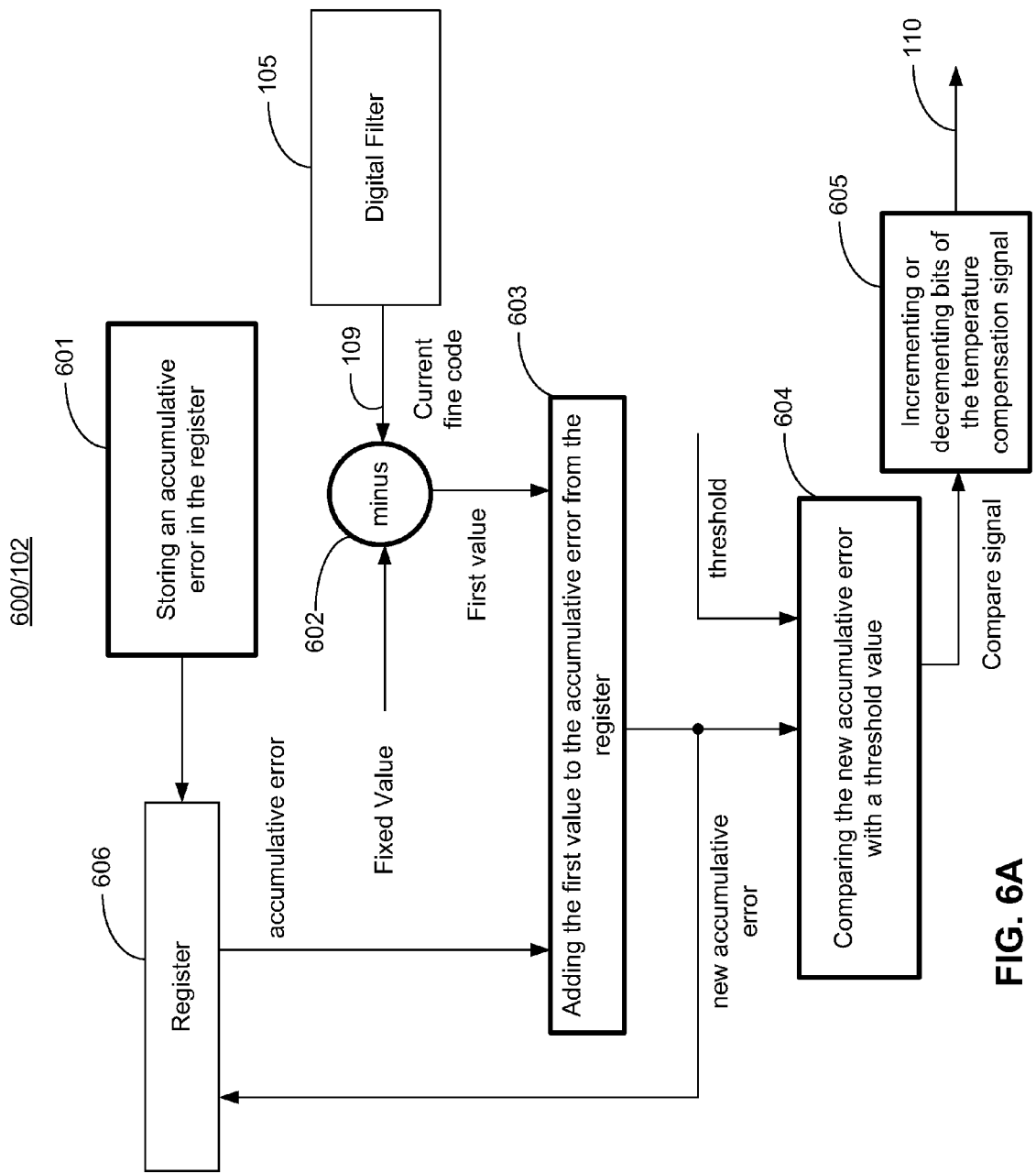
FIG. 6A is a method flowchart for generating a correction code for updating the power supply level of the DCO, according to one embodiment of the invention.

FIG. 6A is a method flowchart 600 for generating the correction code 110 for updating the power supply level 108 of the DCO 106, according to one embodiment of the invention. The flowchart 600 corresponds to the RTL description of the logic unit 102 discussed above with reference to FIG. 1.

At block 601 the logic unit 102 stores an initial value of accumulative error (accumfnerr) in a register 606. In one embodiment, the initial value of accumfnerr is zero. At block 602, a fixedValue is subtracted from the current fine control code 109 to generate a first value. As discussed above, the fixedValue is the middle of the fine control code range. In one embodiment, block 602 is performed every reference clock signal (e.g., at every rising edge of the reference clock signal). At block 603, the first value is added to the accumulative error (accumfnerr) from the register 606 to generate a new accumulative error which is stored in the register 606. In one embodiment, block 603 is performed every reference clock signal (e.g., at every rising edge of the reference clock signal).

At block 604 a comparison is made between the new accumulative error and a threshold value. If the value of the new accumulative error crosses the threshold, then at block 605 the correction code 110 is updated, i.e. incremented by 1. If the value of the new accumulative error crosses the negative threshold then, at block 605, the correction code 110 is reduced (decremented) by 1. In one embodiment, when the correction code 110 is updated, the data in the register 606 is reset to zero. In one embodiment, the threshold is 10000. In other embodiments other values for the threshold may be used.

Figure 6B:
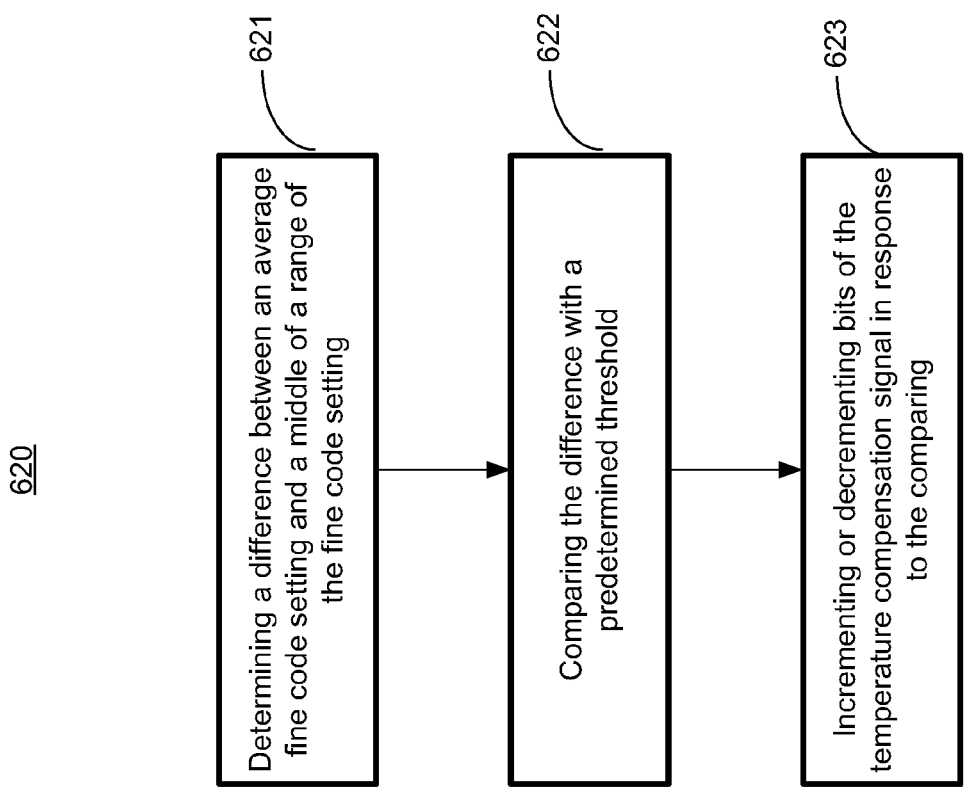
FIG. 6B is a method flowchart for generating a correction code for updating the power supply level of the DCO, according to another embodiment of the invention.

FIG. 6B is a method flowchart 620 for generating a correction code 621 for updating the power supply level 108 of the DCO 106, according to another embodiment of the invention. At block 621, the logic unit 102 determines a difference between an average fine control code and a middle of a range of the fine control code. At block 622, the logic unit 102 compares the difference with a predetermined threshold. In one embodiment, the predetermined threshold is +/−400 when the average fine control code range is −511 to +511. In such an embodiment, if the average exceeds the range (−511 to +511), the correction code 110 is incremented or decremented. In other embodiments, other predetermined threshold may be used depending on the average fine control code range. At block 623, the logic unit 102 generates the correction code 110 (which is initially zero or a predetermined value) by incrementing or decrementing the correction code 110 in response to the comparing. In one embodiment, the predetermined threshold is a programmable threshold. In one embodiment, the threshold can be programmed by means of fuse, metal options, selecting new (preprogrammed or programmable) values from a register, etc.

Figure 7:
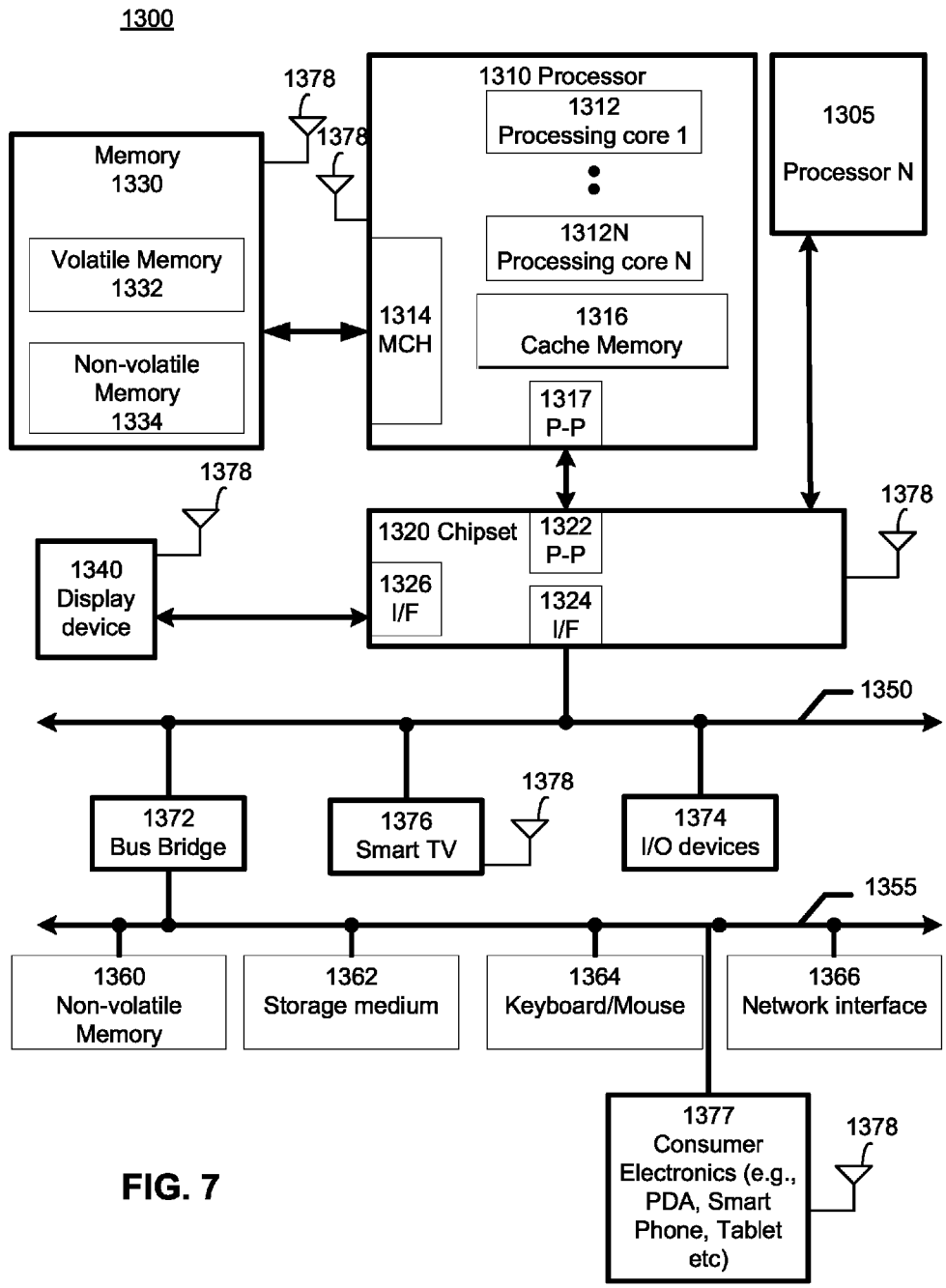
FIG. 7 is a system level diagram comprising the DPLL which is operable to have a fine control code near the middle of the range of the fine code, according to one embodiment of the invention.

FIG. 7 is a system level diagram comprising the DPLL architecture 100 which is operable to have a fine control code near the middle of the range of the fine control code, according to one embodiment of the invention. FIG. 7 also includes a machine-readable storage medium to execute computer readable instructions to perform the methods of various embodiments. Elements of embodiments are also provided as a machine-readable medium for storing the computer-executable instructions (e.g., instructions to implement the flowcharts of FIG. 5, 6A-B). The machine-readable medium may include, but is not limited to, flash memory, optical disks, hard disk drives, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

In one embodiment, the system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 1300 implements the methods disclosed herein and may be a system on a chip (SOC) system.

In one embodiment, the processor 1310 has one or more processing cores 1312 and 1312N, where 1312N represents the Nth processor core inside the processor 1310 where N is a positive integer. In one embodiment, the system 1300 includes multiple processors including processors 1310 and 1305, where processor 1305 has logic similar or identical to logic of processor 1310. In one embodiment, the system 1300 includes multiple processors including processors 1310 and 1305 such that processor 1305 has logic that is completely independent from the logic of processor 1310. In such an embodiment, a multi-package system 1300 is a heterogeneous multi-package system because the processors 1305 and 1310 have different logic units. In one embodiment, the processing core 1312 includes, but is not limited to, pre-fetch logic to fetch instructions, decode logic to decode the instructions, execution logic to execute instructions and the like. In one embodiment, the processor 1310 has a cache memory 1316 to cache instructions and/or data of the system 1300. In another embodiment of the invention, the cache memory 1316 includes level one, level two and level three, cache memory, or any other configuration of the cache memory within the processor 1310.

In one embodiment, processor 1310 includes a memory control hub (MCH) 1314, which is operable to perform functions that enable the processor 1310 to access and communicate with a memory 1330 that includes a volatile memory 1332 and/or a non-volatile memory 1334. In one embodiment, the memory control hub (MCH) 1314 is positioned outside of the processor 1310 as an independent integrated circuit.

In one embodiment, the processor 1310 comprises the improved DPLL architecture 100 of FIG. 1.

In one embodiment, the processor 1310 is also coupled to a wireless antenna 1378 to communicate with any device configured to transmit and/or receive wireless signals. In one embodiment, the wireless antenna interface 1378 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1334 includes, but is not limited to, flash memory (e.g., NAND, NOR), phase change memory (PCM), read-only memory (ROM), electrically erasable programmable read-only memory (EEPROM), or any other type of non-volatile memory device.

The memory 1330 stores information and instructions to be executed by the processor 1310. In one embodiment, memory 1330 may also store temporary variables or other intermediate information while the processor 1310 is executing instructions. In one embodiment, chipset 1320 connects with processor 1310 via Point-to-Point (PtP or P-P) interfaces 1317 and 1322. In one embodiment, chipset 1320 enables processor 1310 to connect to other modules in the system 1300. In one embodiment of the invention, interfaces 1317 and 1322 operate in accordance with a PtP communication protocol such as the INTEL® QuickPath Interconnect (QPI) or the like.

In one embodiment, the chipset 1320 is operable to communicate with the processor 1310, 1305, display device 1340, and other devices 1372, 1376, 1374, 1360, 1362, 1364, 1366, 1377, etc. In one embodiment, the chipset 1320 is also coupled to a wireless antenna 1378 to communicate with any device configured to transmit and/or receive wireless signals.

In one embodiment, chipset 1320 connects to a display device 1340 via an interface 1326. In one embodiment, the display 1340 includes, but is not limited to, liquid crystal display (LCD), plasma, cathode ray tube (CRT) display, or any other form of visual display device. In one embodiment, the display 1340 is a interactive touch pad display. In one embodiment of the invention, processor 1310 and chipset 1320 are merged into a single SOC. In addition, the chipset 1320 connects to one or more buses 1350 and 1355 that interconnect various modules 1374, 1360, 1362, 1364, and 1366. In one embodiment, buses 1350 and 1355 may be interconnected together via a bus bridge 1372 if there is a mismatch in bus speed or communication protocol. In one embodiment, chipset 1320 couples with, but is not limited to, a non-volatile memory 1360, a mass storage device(s) 1362, a keyboard/mouse 1364, and a network interface 1366 via interface 1324, smart TV 1376, consumer electronics 1377, etc.

In one embodiment, the mass storage device 1362 includes, but is not limited to, a solid state drive, a hard disk drive, a universal serial bus flash memory drive, or any other form of computer data storage medium. In one embodiment, network interface 1366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 7 are depicted as separate blocks within the system 1300, the functions performed by some of these blocks may be integrated within a single semiconductor circuit or may be implemented using two or more separate integrated circuits. For example, although the cache memory 1316 is depicted as a separate block within the processor 1310, the cache memory 1316 can be incorporated into the processor core 1312 respectively. In one embodiment, the system 1300 may include more than one processor/processing core in another embodiment of the invention.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

For example, the algorithm implemented by the logic unit 102 may monitor the output of the adder 415 (FIG. 4) of the digital filter 400/105. The output of the adder 415 is an internal representation of the average fine control code. In one embodiment, the output of the adder 415 represents the average position of the fine control code in the fine control code range. In one embodiment, a positive value of the output of the adder 415 indicates that the fine control code 109 is in the top half of the fine control code range. In one embodiment, a negative value indicates that the fine control code 109 is in the bottom half of the fine control code range. In one embodiment, if the output of the adder 415 is positive for more than N consecutive reference clock cycles, the correction code 110 (also called the temperature compensation signal or compensation signal) is incremented by 1. In one embodiment, N=100. In one embodiment, if the output of the adder 415 is negative for more than N consecutive reference clock cycles, then the correction code 110 is decremented by 1.

In one embodiment, the correction code 110 (also called the temperature compensation signal or simply the compensation signal) is generated by the logic 102 by comparing the fine control code setting 109 with a threshold value (e.g., 100000) to generate a compare signal which is then filtered to generate the correction code 110.

The embodiments of the invention are intended to embrace all such alternatives, modifications, and variations as to fall within the broad scope of the appended claims.

I claim:

1. An apparatus comprising:
a digital phase locked loop (DPLL) including a digital filter to generate a fine code for controlling a frequency of an output signal of a digital controlled oscillator (DCO) of the DPLL, the DCO being supplied a power supply level;
a logic unit to monitor the fine code and to generate a compensation signal based on the fine code; and
a voltage adjustment unit to update the power supply level based on the compensation signal.

2. The apparatus of claim 1, wherein the compensation signal is a temperature compensation signal, and wherein the updated power supply level to cause the digital filter to generate the fine code to be near the middle of an entire range of the fine code across various temperatures.

3. The apparatus of claim 1, wherein the voltage adjustment unit comprises:
an adjustable reference voltage generator to generate a reference voltage according to the compensation signal; and
a voltage regulator to generate the updated power supply level for the DCO, the updated power supply level based on the reference voltage.

4. The apparatus of claim 3, wherein the adjustable reference voltage generator comprises a bandgap reference generator.

5. The apparatus of claim 3, wherein the adjustable reference voltage generator comprises a resistor divider network.

6. The apparatus of claim 3 further comprises:
a low pass filter (LPF) coupled to the adjustable reference voltage generator and the voltage adjustment unit, the LPF to filter the reference voltage.

7. The apparatus of claim 1, wherein the logic unit comprises:
a register to store an accumulative error;
a subtraction unit to subtract a fixed value from a current code value of the fine code, the subtraction unit to generate a first value;
a first adder to add the first value to the accumulative error from the register, and to store the output as a new accumulative error in the register;
a comparator to compare the new accumulative error with a threshold value; and
a second adder to increment bits of the compensation signal in response to the output of the comparator.

8. The apparatus of claim 7, wherein the fixed value represents the middle of a range of the fine code.

9. The apparatus of claim 7, wherein the threshold value is programmable.

10. The apparatus of claim 1, wherein the logic unit comprises:
a comparator to compare the fine code with a threshold value, the comparator to output a compare signal; and
a filter, coupled to the comparator, to filter the compare signal and to generate the compensation signal.

11. The apparatus of claim 1, wherein the logic unit is part of the digital filter of the DPLL.

12. The apparatus of claim 1, wherein the logic unit comprises:
logic for determining a difference between an average fine code and a middle of a range of the fine code;
logic for comparing the difference with a predetermined threshold; and
logic for incrementing or decrementing bits of the compensation signal in response to the comparing.

13. A method comprising:
generating a fine code for controlling a frequency of an output signal of a digitally controlled oscillator (DCO) of a digital phase locked loop (DPLL), the DCO being supplied a power supply level;
monitoring the fine code;
generating a compensation signal based on the monitored fine code; and
updating the power supply level based on the compensation signal.

14. The method of claim 13, wherein the compensation signal is a temperature compensation signal, and wherein updating the power supply level causes the fine code to be near the middle of an entire range of the fine code across various temperatures.

15. The method of claim 13, wherein generating the compensation signal comprises:
storing in a register an accumulative error;
subtracting a predetermined value from a current code value, of the fine code, to generate a first value;
adding the first value to the accumulative error from the register;

storing the output as a new accumulative error in the register;

comparing the new accumulative error with a threshold value; and incrementing or decrementing bits of the compensation signal in response to the comparing.

16. The method of claim 15, wherein the predetermined value represents the middle of a range of the fine code.

17. The method of claim 13, wherein generating the compensation signal comprises:

comparing the fine code with a threshold value to generate a compare signal; and filtering the compare signal to generate the compensation signal.

18. The method of claim 13, wherein updating the power supply level based on the compensation signal comprises:

generating a reference voltage according to the compensation signal, wherein the updated power supply level is based on the reference voltage.

19. The method of claim 13, wherein updating the power supply level comprises adjusting an output voltage level of a bandgap reference generator according to the compensation signal.

20. The method of claim 13, wherein updating the power supply level comprises selecting voltage node from a resistor divider network according to the compensation signal.

21. The method of claim 13, wherein generating the compensation signal comprises:

determining a difference between an average fine code and a middle of a range of the fine code;

comparing the difference with a predetermined threshold; and incrementing or decrementing bits of the compensation signal in response to the comparing.

22. A system comprising:

a display; and a processor coupled to the display, the processor comprising:

a digital phase locked loop (DPLL) including a digital filter to generate a fine code for controlling a frequency of an output signal of a digitally controlled oscillator (DCO) of the DPLL, the DCO being supplied a power supply level;

a logic unit to monitor the fine code and to generate a compensation signal based on the fine code; and a voltage adjustment unit to update the power supply level based on the compensation signal.

23. The system of claim 22, wherein the display is a touch pad.

24. The system of claim 22, wherein the updated power supply level to cause the digital filter to output the fine code to be near the middle of an entire range of the fine code across various temperatures.

25. The system of claim 22, wherein the voltage adjustment unit comprises:

an adjustable reference voltage generator to generate a reference voltage according to the compensation signal; and a voltage regulator to generate the updated power supply level for the DCO, the updated power supply level based on the reference voltage.

26. The system of claim 22, wherein the logic unit comprises:

a register to store an accumulative error;

a subtraction unit to subtract a fixed value from a current code value of the fine code, the subtraction unit to generate a first value;

a first adder to add the first value to the accumulative error from the register, and to store the output as a new accumulative error in the register;

a comparator to compare the new accumulative error with a threshold value; and a second adder to increment bits of the compensation signal in response to the output of the comparator.

27. The system of claim 22, wherein the logic unit comprises:

a comparator to compare the fine code with a threshold value, the comparator to output a compare signal; and a filter coupled to the comparator to filter the compare signal, and to generate the compensation signal.

28. The system of claim 22, wherein the logic unit comprises:

logic for determining a difference between an average fine code and a middle of a range of the fine code;

logic for comparing the difference with a predetermined threshold; and logic for incrementing or decrementing bits of the compensation signal in response to the comparing.

* * * * *